(12) United States Patent
Fukuzumi et al.

(10) Patent No.: US 9,431,419 B2
(45) Date of Patent: Aug. 30, 2016

(54) SEMICONDUCTOR MEMORY DEVICE AND METHOD FOR MANUFACTURING SAME

(71) Applicant: Kabushiki Kaisha Toshiba, Minato-ku (JP)

(72) Inventors: Yoshiaki Fukuzumi, Yokkaichi (JP); Masaki Tsuji, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/722,543

(22) Filed: May 27, 2015

(65) Prior Publication Data

US 2016/0079267 A1   Mar. 17, 2016

Related U.S. Application Data

(60) Provisional application No. 62/049,498, filed on Sep. 12, 2014.

(51) Int. Cl.
*H01L 21/00* (2006.01)
*H01L 27/115* (2006.01)

(52) U.S. Cl.
CPC ... *H01L 27/11582* (2013.01); *H01L 27/11556* (2013.01)

(58) Field of Classification Search
CPC .............. H01L 27/11582; H01L 27/11556
See application file for complete search history.

(56) References Cited

U.S. PATENT DOCUMENTS

| | | | | |
|---|---|---|---|---|
| 7,936,004 B2 * | 5/2011 | Kito | .................... | H01L 21/8221 257/324 |
| 8,008,710 B2 | 8/2011 | Fukuzumi et al. | | |
| 8,193,571 B2 * | 6/2012 | Katsumata | ........ | H01L 27/11578 257/302 |
| 8,264,031 B2 * | 9/2012 | Kidoh | ............... | H01L 27/11578 257/315 |
| 8,294,199 B2 | 10/2012 | Yahashi et al. | | |
| 8,304,348 B2 | 11/2012 | Hashimoto | | |
| 8,372,720 B2 | 2/2013 | Fukuzumi et al. | | |
| 8,374,033 B2 * | 2/2013 | Kito | ................... | G11C 16/0483 365/185.05 |
| 8,378,406 B2 * | 2/2013 | Katsumata | ........ | H01L 27/11573 257/314 |
| 8,455,941 B2 | 6/2013 | Ishihara et al. | | |
| 8,551,838 B2 * | 10/2013 | Kito | .................... | H01L 21/8221 257/E21.613 |
| 8,569,826 B2 * | 10/2013 | Kidoh | ............... | H01L 27/11573 257/324 |
| 8,633,526 B2 * | 1/2014 | Hattori | ................ | H01L 27/1157 257/225 |
| 8,653,577 B2 | 2/2014 | Fukuzumi et al. | | |
| 8,654,586 B2 * | 2/2014 | Kito | ................... | G11C 16/0483 365/185.05 |
| 8,729,624 B2 | 5/2014 | Fukuzumi et al. | | |

(Continued)

FOREIGN PATENT DOCUMENTS

JP    2013-197419    9/2013

*Primary Examiner* — Laura Menz
(74) *Attorney, Agent, or Firm* — Oblon, McClelland, Maier & Neustadt, L.L.P.

(57) ABSTRACT

According to one embodiment, a first layer; a stacked body provided above the first layer and including a plurality of electrode layers separately stacked each other; a second layer provided between the first layer and the stacked body; an intermediate layer provided between the first layer and the second layer; a semiconductor body provided in the stacked body, the second layer, the intermediate layer and the first layer, the semiconductor body extending in a stacking direction of the stacked body; and a charge storage film provided between the semiconductor body and the plurality of electrode layers. The semiconductor body includes a side surface connected with the intermediate layer in the vicinity of a boundary between the first layer and the second layer. At least one of the first layer and the second layer has conductivity and is connected with the intermediate layer.

14 Claims, 8 Drawing Sheets

(56) References Cited

U.S. PATENT DOCUMENTS

| | | | |
|---|---|---|---|
| 8,748,971 B2* | 6/2014 | Tanaka | H01L 27/11578 257/324 |
| 8,884,355 B2* | 11/2014 | Komori | H01L 27/11573 257/316 |
| 9,000,504 B2* | 4/2015 | Hattori | H01L 27/1157 257/225 |
| 9,035,374 B2 | 5/2015 | Fukuzumi et al. | |
| 9,064,735 B2* | 6/2015 | Kito | H01L 21/8221 |
| 9,224,752 B1* | 12/2015 | Lee | H01L 27/11582 |
| 2006/0153611 A1* | 7/2006 | Murakami | G03G 15/6552 399/405 |
| 2007/0252201 A1* | 11/2007 | Kito | H01L 21/8221 257/331 |
| 2010/0013049 A1* | 1/2010 | Tanaka | H01L 21/76816 257/532 |
| 2010/0038699 A1* | 2/2010 | Katsumata | H01L 27/11578 257/324 |
| 2010/0200906 A1* | 8/2010 | Kidoh | H01L 27/11578 257/324 |
| 2010/0207194 A1* | 8/2010 | Tanaka | H01L 27/11578 257/324 |
| 2011/0031550 A1* | 2/2011 | Komori | H01L 27/11573 257/324 |
| 2011/0051527 A1* | 3/2011 | Kirisawa | G11C 16/0483 365/185.29 |
| 2011/0147818 A1* | 6/2011 | Katsumata | H01L 27/11573 257/314 |
| 2011/0284947 A1* | 11/2011 | Kito | H01L 21/8221 257/324 |
| 2011/0287597 A1* | 11/2011 | Kito | H01L 21/8221 438/261 |
| 2011/0309431 A1* | 12/2011 | Kidoh | H01L 27/11573 257/324 |
| 2012/0052672 A1 | 3/2012 | Nakanishi et al. | |
| 2012/0112171 A1* | 5/2012 | Hattori | H01L 27/1157 257/40 |
| 2013/0062681 A1 | 3/2013 | Fujiki et al. | |
| 2013/0193503 A1* | 8/2013 | Lee | H01L 27/11582 257/314 |
| 2013/0320424 A1* | 12/2013 | Lee | H01L 27/1158 257/314 |
| 2014/0021531 A1* | 1/2014 | Kidoh | H01L 27/11573 257/324 |
| 2014/0097485 A1* | 4/2014 | Hattori | H01L 27/1157 257/325 |
| 2014/0131783 A1* | 5/2014 | Lee | H01L 27/11556 257/314 |
| 2015/0035037 A1* | 2/2015 | Sakuma | H01L 29/66833 257/314 |
| 2015/0044835 A1* | 2/2015 | Hattori | H01L 27/1157 438/268 |
| 2015/0357343 A1* | 12/2015 | Ishida | H01L 27/11582 257/43 |
| 2015/0372006 A1* | 12/2015 | Kito | H01L 21/8221 257/314 |
| 2016/0035792 A1* | 2/2016 | Takahashi | H01L 27/2481 257/4 |
| 2016/0071593 A1* | 3/2016 | Hashimoto | G11C 16/08 365/185.33 |
| 2016/0071873 A1* | 3/2016 | Tsuji | H01L 27/11582 257/324 |
| 2016/0079164 A1* | 3/2016 | Fukuzumi | H01L 23/5226 257/324 |
| 2016/0079256 A1* | 3/2016 | Inaba | H01L 27/11568 257/324 |
| 2016/0079267 A1* | 3/2016 | Fukuzumi | H01L 27/11582 257/314 |

* cited by examiner

SEMICONDUCTOR MEMORY DEVICE AND METHOD FOR MANUFACTURING SAME

This application is based upon and claims the benefit of priority from U.S. Provisional Patent Application 62/049,498 field on Sep. 12, 2014; the entire contents of which are incorporated herein by reference.

FIELD

Embodiments described herein relate generally to a semiconductor memory device and a method for manufacturing same.

BACKGROUND

Memory devices having a three-dimensional structure have been proposed, in which a memory hole is formed in a stacked body including a plurality of electrode layers that function as control gates in memory cells and are stacked with a plurality of insulating layers each provided between the electrode layers, and a silicon body serving as a channel is provided on the side wall of the memory hole via a charge storage film.

In the stacked body including the plurality of electrode layers and the plurality of insulating layer in such a three-dimensional memory device, the memory hole is formed by, for example, a reactive ion etching (RIE) method. A memory film including the charge storage film is formed on the inner wall of the memory hole, and a channel body is formed inside the memory film. In a structure in which, for example, a source layer is provided below the stacked body, it has been proposed to remove the memory film formed on the bottom portion of the memory hole by etching for connecting the lower end of the channel body with the source layer. In this case, the memory film formed on the side wall of the memory hole is also affected by etching in some cases.

DETAILED DESCRIPTION

Figure 1:
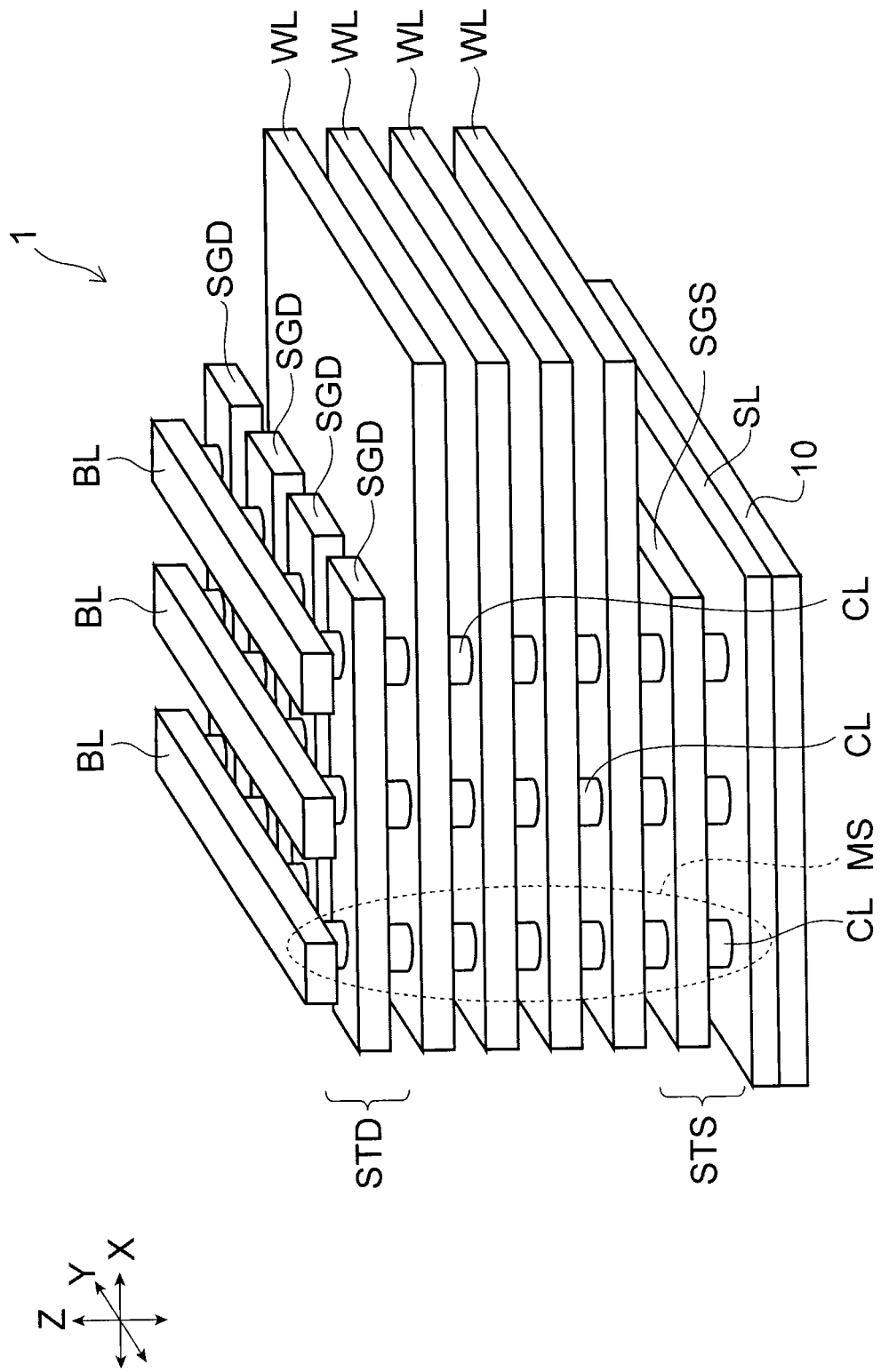
FIG. 1 is a schematic perspective view of a memory cell array of an embodiment.

According to one embodiment, a first layer; a stacked body provided above the first layer and including a plurality of electrode layers separately stacked each other; a second layer provided between the first layer and the stacked body; an intermediate layer provided between the first layer and the second layer; a semiconductor body provided in the stacked body, the second layer, the intermediate layer and the first layer, the semiconductor body extending in a stacking direction of the stacked body; and a charge storage film provided between the semiconductor body and the plurality of electrode layers. The semiconductor body includes a side surface connected with the intermediate layer in the vicinity of a boundary between the first layer and the second layer. At least one of the first layer and the second layer has conductivity and is connected with the intermediate layer.

Hereinafter, embodiments will be described with reference to the drawings. In the drawings, the same elements are denoted by the same reference numerals and signs.

FIG. 1 is a schematic perspective view of a memory cell array 1 of an embodiment. In FIG. 1, insulating layers and the like are not shown for clarity of the drawing.

In FIG. 1, two directions parallel to a major surface of a substrate 10 and orthogonal to each other are defined as an X-direction and a Y-direction, and a direction orthogonal to both the X-direction and the Y-direction is defined as a Z-direction (stacking direction).

Figure 2:
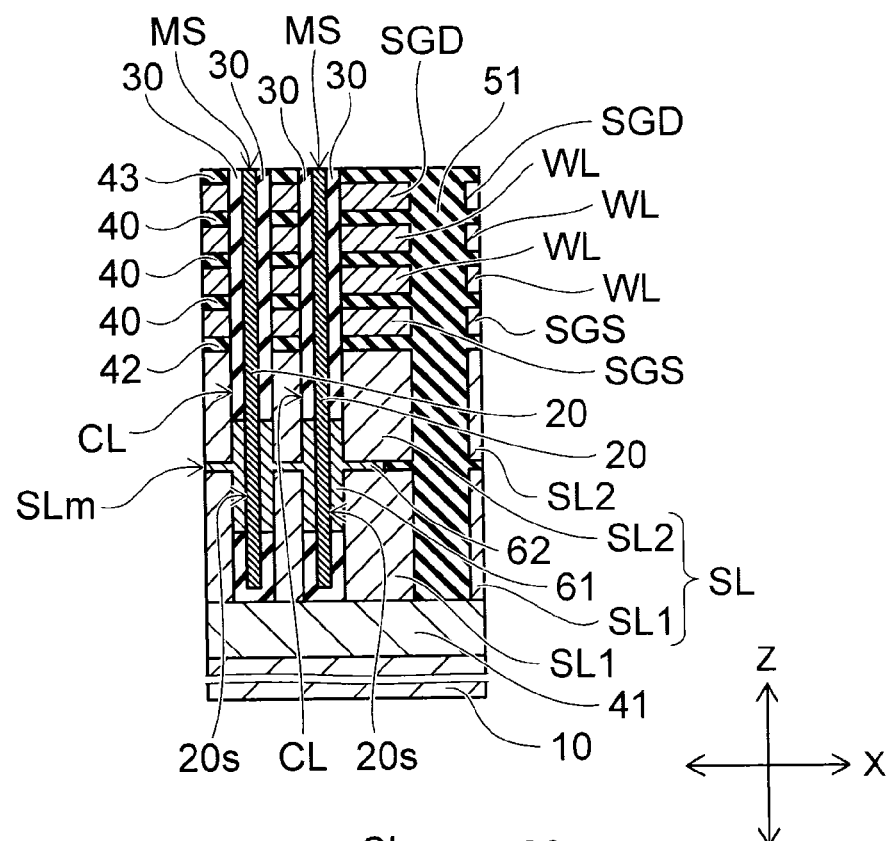
FIG. 2 is a schematic cross-sectional view of the memory string of the embodiment.

The memory cell array 1 includes a plurality of memory strings MS. FIG. 2 is a schematic cross-sectional view of the memory strings MS. FIG. 2 shows a cross-section parallel to an XZ plane in FIG. 1.

A source layer SL (first source layer SL1 and second source layer SL2) is provided on the substrate 10. A source-side selection gate SGS (lower selection gate or lower gate layer) is provided on the source layer SL via an insulating layer 42.

An insulating layer 40 is provided on the source-side selection gate SGS. On the insulating layer 40, a stacked body including a plurality of electrode layers WL (word line stacked films) and a plurality of insulating layers 40 alternately stacked on each other is provided. The plurality of electrode layers WL is separately stacked each other, and the insulating layers 40 are provided among the electrode layers WL. The number of electrode layers WL shown in the drawing is illustrative only, and any number of electrode layers WL may be used.

An insulating layer 40 is provided on the electrode layer WL in the uppermost layer, and a drain-side selection gate SGD (upper selection gate or upper gate layer) is provided on the insulating layer 40.

The stacked body on the source layer SL includes the source-side selection gate SGS, the drain-side selection gate SGD, and the plurality of electrode layers WL.

Each of the source-side selection gate SGS, the drain-side selection gate SGD, and the electrode layer WL is a silicon layer containing silicon as a main component. The silicon layer is doped with, for example, boron as an impurity for providing conductivity. Moreover, each of the source-side selection gate SGS, the drain-side selection gate SGD, and the electrode layer WL may include metal silicide (for example, tungsten silicide). The insulating layer 40 mainly contains, for example, silicon oxide.

Each of the drain-side selection gate SGD and the source-side selection gate SGS may have a thickness greater than that of one electrode layer WL, or may have a structure including a plurality of gate electrodes.

The stacked body is provided with columnar portions CL extending in the Z-direction. The columnar portion CL penetrates the drain-side selection gate SGD, the plurality of electrode layers WL below the drain-side selection gate SGD, and the source-side selection gate SGS. The columnar portion CL is formed into, for example, a circular cylindrical or elliptical cylindrical shape.

The stacked body is provided with an insulating isolation portion 51 (insulating portion) extending in the Z-direction. The insulating isolation portion 51 penetrates the drain-side selection gate SGD, the plurality of electrode layers WL below the drain-side selection gate SGD, the source-side selection gate SGS, and the source layer SL to reach a conductive layer 41 (metal backing) below the source layer SL. The insulating isolation portion 51 extends in a direction penetrating the paper surface in FIG. 2, and isolates the stacked body into a plurality of blocks. The conductive layer 41 contains metal or a metal compound.

Figure 3:
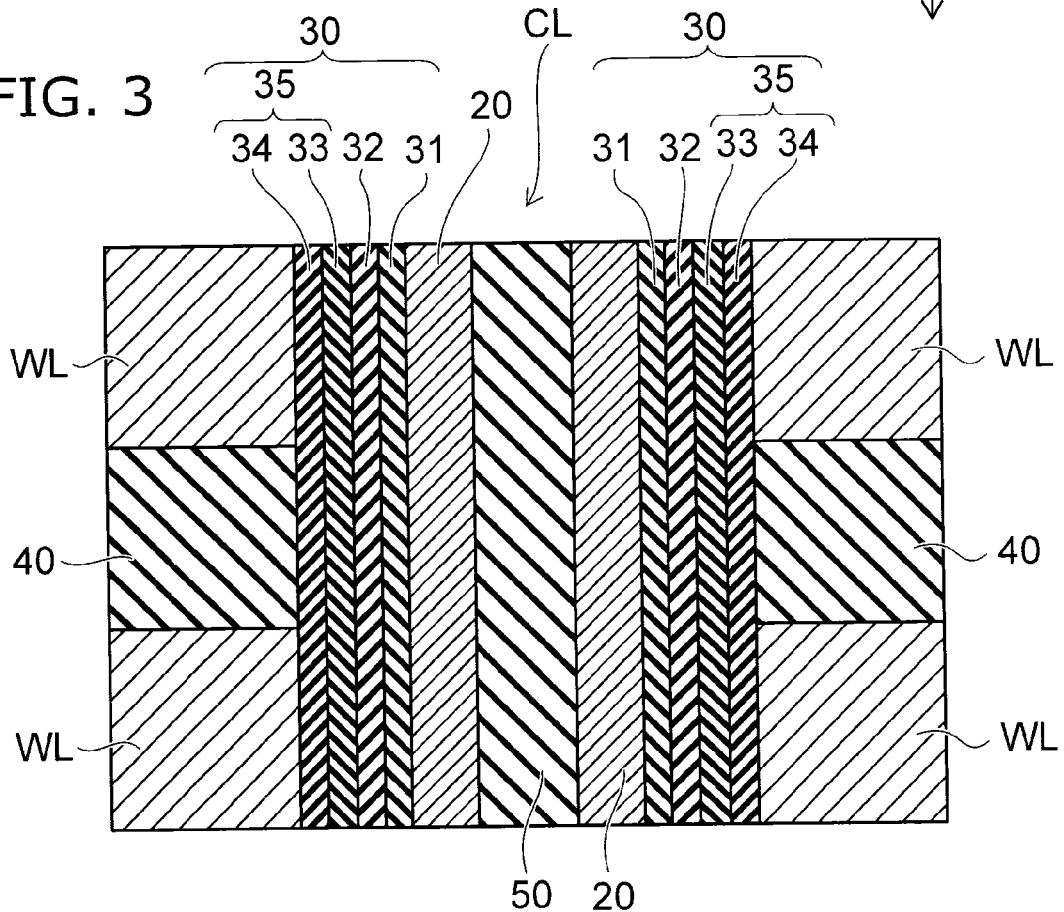
FIG. 3 is an enlarged schematic sectional view of a part of the columnar section of the embodiment.

FIG. 3 is an enlarged schematic cross-sectional view of a portion of the columnar portion CL of the embodiment.

The columnar portion CL is formed in each of memory holes MH (FIG. 5B) formed in the stacked body including the plurality of electrode layers WL and the plurality of insulating layers 40. In the memory hole MH, a channel body 20 (semiconductor body) as a semiconductor channel is provided. The channel body 20 is, for example, a silicon film containing silicon as a main component. The impurity concentration of the channel body 20 is, for example, lower than the impurity concentration of the electrode layer WL.

The channel body 20 is provided to extend in the stacking direction of the stacked body. The upper end of the channel body 20 is connected to a bit line BL (for example, a metal film) shown in FIG. 1, and a portion of the channel body 20 on the lower end side is connected to the source layer SL. Each bit line BL extends in the Y-direction.

A memory film 30 is provided between the inner wall of the memory hole MH and the channel body 20. The memory film 30 includes a block insulating film 35, a charge storage film 32, and a tunnel insulating film 31. The memory film 30 is provided to extend in the stacking direction of the stacked body.

Between the electrode layers WL and the channel body 20, the block insulating film 35, the charge storage film 32, and the tunnel insulating film 31 are provided in this order from the electrode layer WL side. The block insulating film 35 is in contact with the electrode layers WL. The tunnel insulating film 31 is in contact with the channel body 20. The charge storage film 32 is provided between the block insulating film 35 and the tunnel insulating film 31.

The channel body 20 is provided in a tubular shape extending in the stacking direction of the stacked body. The memory film 30 is provided in a tubular shape so as to surround the outer circumferential surface of the channel body 20 while extending in the stacking direction of the stacked body. The electrode layers WL surround the channel body 20 via the memory film 30. Moreover, a core insulating film 50 is provided inside the channel body 20. The core insulating film 50 is, for example, a silicon oxide film.

The channel body 20 functions as a channel in each of memory cells, and the electrode layer WL functions as a control gate of the memory cell. The charge storage film 32 functions as a data memory layer that stores charge injected from the channel body 20. That is, at intersecting portions between the channel body 20 and the electrode layers WL, the memory cells having a structure in which the control gates surround the channel are formed.

In the semiconductor memory device of the embodiment, data can be electrically erased or programmed freely, and the memory contents can be held even when power is turned off.

The memory cell is, for example, a charge trap-type memory cell. The charge storage film 32 has many trap sites to trap charge, and is, for example, a silicon nitride film.

The tunnel insulating film 31 serves as a potential barrier when charge is injected from the channel body 20 into the charge storage film 32 or when the charge stored in the charge storage film 32 diffuses into the channel body 20. The tunnel insulating film 31 is, for example, a silicon oxide film.

Alternatively, as the tunnel insulating film 31, a stacked film (ONO film) having a structure in which a silicon nitride film is interposed between a pair of silicon oxide films may be used. When the ONO film is used as the tunnel insulating film 31, an erase operation can be performed at a low electric field, compared to a single layer of silicon oxide film.

The block insulating film 35 prevents the charge stored in the charge storage film 32 from diffusing into the electrode layer WL. The block insulating film 35 includes a cap film 34 provided to be in contact with the electrode layer WL and a block film 33 provided between the cap film 34 and the charge storage film 32.

The block film 33 is, for example, a silicon oxide film. The cap film 34 is a film having a permittivity higher than that of silicon oxide, and is, for example, a silicon nitride film. By providing the cap film 34 to be in contact with the electrode layer WL, back-tunneling electrons injected from the electrode layer WL can be suppressed in erasing. That is, the stacked film of a silicon oxide film and a silicon nitride film is used as the block insulating film 35, so that charge blocking property can be enhanced.

As shown in FIG. 1, a drain-side selection transistor STD is provided at the upper end portion of the columnar portion CL in the memory string MS, while a source-side selection transistor STS is provided at the lower end portion.

The memory cell, the drain-side selection transistor STD, and the source-side selection transistor STS are each a vertical transistor in which current flows in the stacking direction (the Z-direction) of the stacked body 15.

The drain-side selection gate SGD functions as a gate electrode (control gate) of the drain-side selection transistor STD. An insulating film that functions as a gate insulating film of the drain-side selection transistor STD is provided between the drain-side selection gate SGD and the channel body 20.

The source-side selection gate SGS functions as a gate electrode (control gate) of the source-side selection transistor STS. An insulating film that functions as a gate insulating film of the source-side selection transistor STS is provided between the source-side selection gate SGS and the channel body 20.

A plurality of memory cells each using the electrode layer WL as a control gate are provided between the drain-side selection transistor STD and the source-side selection transistor STS.

The plurality of memory cells, the drain-side selection transistor STD, and the source-side selection transistor STS are connected in series through the channel body 20 to configure one memory string MS. A plurality of the memory strings MS are arranged in the X-direction and the Y-direction, so that the plurality of memory cells is provided three-dimensionally in the X-direction, the Y-direction, and the Z-direction.

As shown in FIG. 2, between the substrate 10 and the stacked body, the conductive layer 41 (metal backing), the first source layer SL1 (first layer), an intermediate layer SLm, and the second source layer SL2 (second layer) are provided in this order from the substrate 10 side. At least one of the first source layer SL1 and the second source layer SL2 has conductivity.

Each of the first source layer SL1 and the second source layer SL2 is, for example, a silicon layer containing silicon as a main component. The silicon layer is doped with, for example, phosphorus as an impurity for providing conductivity.

The intermediate layer SLm includes a side wall film 61 (first film) and an inter-layer film 62 (second film). Each of the side wall film 61 and the inter-layer film 62 is a silicon film containing silicon as a main component. Each of the side wall film 61 and the inter-layer film 62 contains, for example, the same material as that of the first source layer SL1 and the second source layer SL2.

The conductive layer 41 is provided between the substrate 10 and the second source layer SL2. The conductive layer 41 contains metal. Here, metal is not limited to pure metal, but includes a metal compound. The conductive layer contains, for example, at least any of tungsten and tantalum.

The inter-layer film 62 of the intermediate layer SLm is provided between the first source layer SL1 and the second source layer SL2 while being in contact with the first source layer SL1 and the second source layer SL2. The intermediate layer SLm is continuously provided between the plurality of columnar portions CL that penetrate the intermediate layer SLm.

At least one of the first source layer SL1 and the second source layer SL2 is electrically connected with the intermediate layer SLm. For example, the intermediate layer SLm is electrically connected with each of the first source layer SL1 and the second source layer SL2. The first source layer SL1 is in contact with the conductive layer 41, and electrically connected with the conductive layer 41. Due to this, the intermediate layer SLm is electrically connected with the conductive layer 41 via the first source layer SL1.

The lower end of the channel body 20 does not reach the conductive layer 41, and is located in the first source layer SL1.

The channel body 20 includes a side surface 20s not covered with the memory film 30 in the vicinity of a boundary between the second source layer SL2 and the first source layer SL1. Side surfaces of the channel body 20, which are lower and higher than the side surface 20s, are covered with the memory film 30. The memory film 30 is provided between the conductive layer 41 and the lower end face (bottom portion) of the channel body 20, and the lower end of the channel body 20 is covered with the memory film 30.

The side surface 20s of the channel body 20 is in contact with the side wall film 61, and covered with the side wall film 61. The side wall film 61 is provided between the side surface 20s of the channel body 20 and the first source layer SL1. The side wall film 61 is provided between the side surface 20s of the channel body 20 and the second source layer SL2.

The memory film 30 is divided in the stacking direction of the stacked body by the side wall film 61 in the vicinity of the boundary between the second source layer SL2 and the first source layer SL1.

The side surface 20s of the channel body 20 that is in contact with the side wall film 61 is electrically connected with the intermediate layer SLm. That is, the channel body 20 is electrically connected with each of the first source layer SL1 and the second source layer SL2 via the intermediate layer SLm.

According to the embodiment, with the use of the side surface 20s having a surface area larger than that of the lower end face (bottom portion), the channel body 20 is in contact with the intermediate layer SLm connected with the source layer SL. For this reason, a contact resistance between the channel body 20 and the source layer SL is reduced.

Moreover, the whole of a stacked body of the source layer SL and the conductive layer 41 functions as a source. Since the source includes the conductive layer 41 whose resistance is lower than that of a semiconductor layer, the electrical resistance is low and thus higher speed operation can be achieved.

In addition to this, since the memory string MS of the embodiment has a straight-type (I-shaped type) structure, the block size can be made smaller than that of a U-shaped type structure. Due to this, it is easy to adopt a structure to increase the number of bit lines, and thus higher speed operation can be achieved without increasing the block size.

The source layer SL is, for example, a phosphorus-doped polysilicon layer. The work function of the phosphorus-doped polysilicon is lower compared to the work function of undoped amorphous silicon used for the channel body 20. For this reason, when the source layer SL is set to 0V for example, not only is a portion of the channel body 20 that is in contact with the intermediate layer SLm at 0V, but also an inversion layer is generated in the channel body 20 facing the vicinity of the upper end portion of the second source layer SL2 via the memory film 30. Through the inversion layer, electrical continuity can be established between a portion of the channel body 20 facing the source-side selection gate SGS and a portion of the channel body 20 connected to the source layer SL via the intermediate layer SLm.

Next, a method for manufacturing the semiconductor memory device of an embodiment will be described with reference to FIG. 4A to FIG. 6D.

Figure 4A:
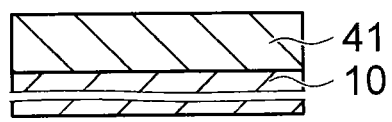
FIG. 4A to FIG. 6D are schematic views showing a method for manufacturing the semiconductor memory device of the embodiment.

As shown in FIG. 4A, the conductive layer 41 is formed on the substrate 10. As the conductive layer 41, a high-melting-point metal having a relatively large atomic number (for example, tungsten, tantalum, or the like) is used. For example, tungsten silicide is used as the conductive layer 41. Due to this, when the memory hole MH and the like described later are formed, the conductive layer 41 can be used as an etching stopper.

Figure 4B:
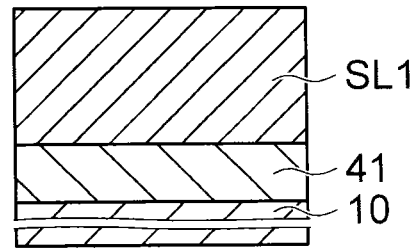

As shown in FIG. 4B, the first source layer SL1 (first layer) is formed on the conductive layer 41. For example, phosphorus-doped polysilicon is used as the first source layer SL1.

Figure 4C:
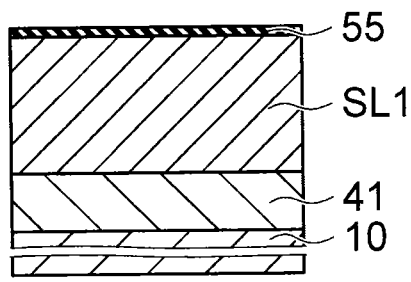

As shown in FIG. 4C, a sacrificial layer 55 is formed on the first source layer SL1. In a process described later, the sacrificial layer 55 is removed, and an amorphous silicon film is embedded in the portion from which the sacrificial layer 55 is removed, to form the intermediate layer SLm (replacing process). For example, a silicon nitride film is used as the sacrificial layer 55.

Figure 4D:
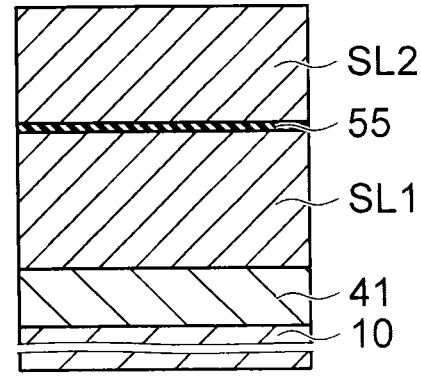
Figure 5A:
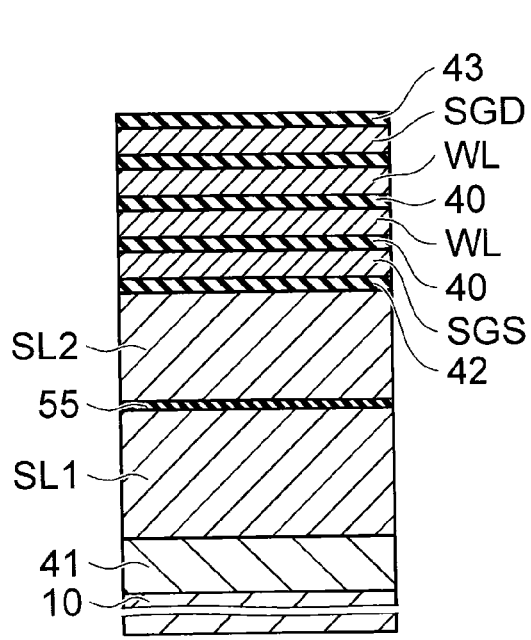

As shown in FIG. 4D, the second source layer SL2 (second layer) is formed on the sacrificial layer 55. Thereafter, the source-side selection gate SGS is formed on the second source layer SL2 via the insulating layer 42 as shown in FIG. 5A.

Next, the stacked body including the insulating layers 40 and the electrode layers WL (third layer) alternately stacked on each other is formed on the source-side selection gate SGS. The drain-side selection gate SGD is formed on the electrode layer WL in the uppermost layer via the insulating layer 40. As shown in FIG. 5A, an insulating layer 43 is formed on the drain-side selection gate SGD.

Figure 5B:
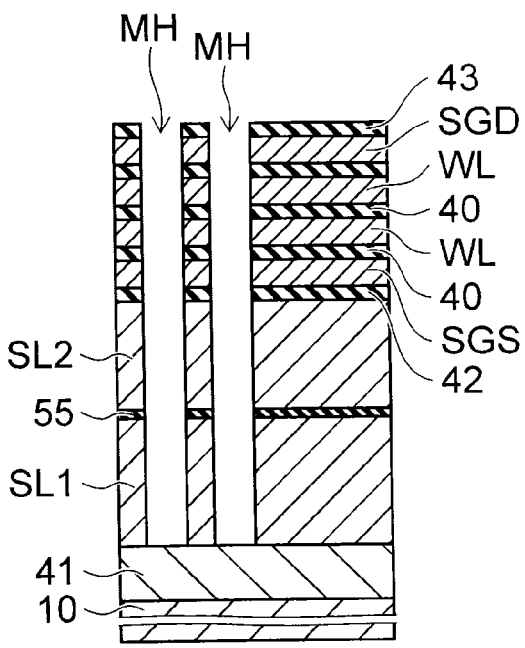

Next, as shown in FIG. 5B, the memory holes MH are formed. The memory holes MH are formed by, for example, a RIE method using a mask (not shown). When the memory holes MH are formed, the conductive layer 41 is used as an etching stopper.

Figure 5C:
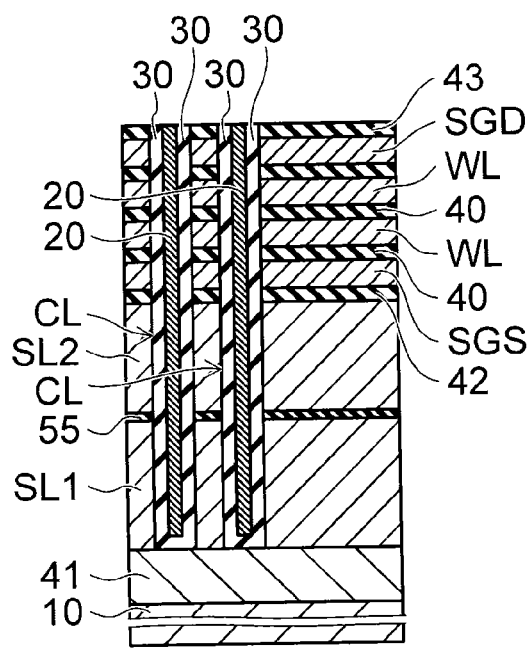

The memory hole MH penetrates from the insulating layer 43 to the first source layer SL1. After forming the memory holes MH, the films (films including the memory film 30 and the channel body 20) shown in FIG. 3 are successively formed on the inner wall (side wall and bottom portion) of each of the memory holes MH as shown in FIG. 5C. Due to this, the columnar portions CL are formed.

Figure 5D:
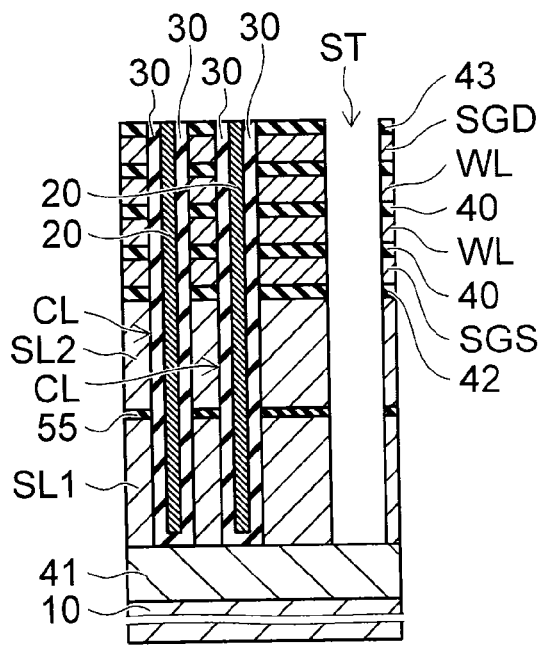

Thereafter, as shown in FIG. 5D, a slit ST is formed. The slit ST is formed by, for example, a RIE method using a mask (not shown). When the slit ST is formed, the conductive layer 41 is used as an etching stopper. The slit ST penetrates from the insulating layer 43 to the first source layer SL1. The sacrificial layer 55 is exposed in the side walls of the slit ST.

Figure 6A:
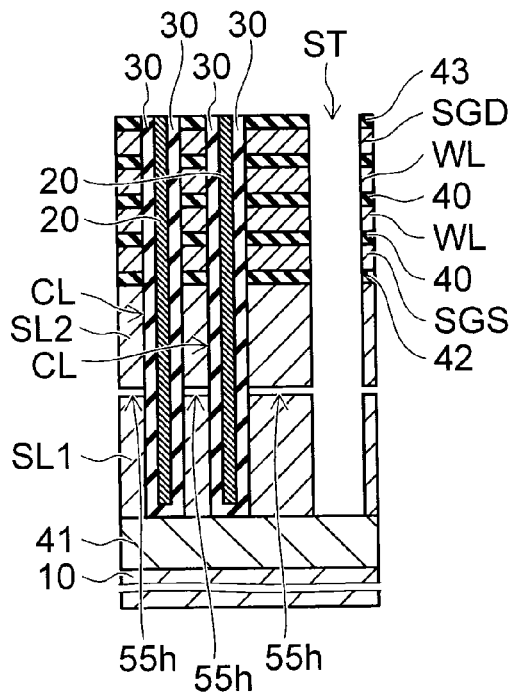

As shown in FIG. 6A, the sacrificial layer 55 is removed by etching through the slit ST. As a method for removing the sacrificial layer 55 that is, for example, a silicon nitride film, an isotropic etching method using, for example, a hot phosphoric acid solution is performed. Due to this, a cavity 55h is formed between the first source layer SL1 and the second source layer SL2. The cavity 55h is in communication with the slit ST. The stacked body above the cavity 55h is supported by the plurality of columnar portions CL.

The columnar portion CL penetrates the cavity 55h, and the memory film 30 is exposed in the cavity 55h. The memory film 30 exposed in the cavity 55h covers the channel body 20.

Figure 6B:
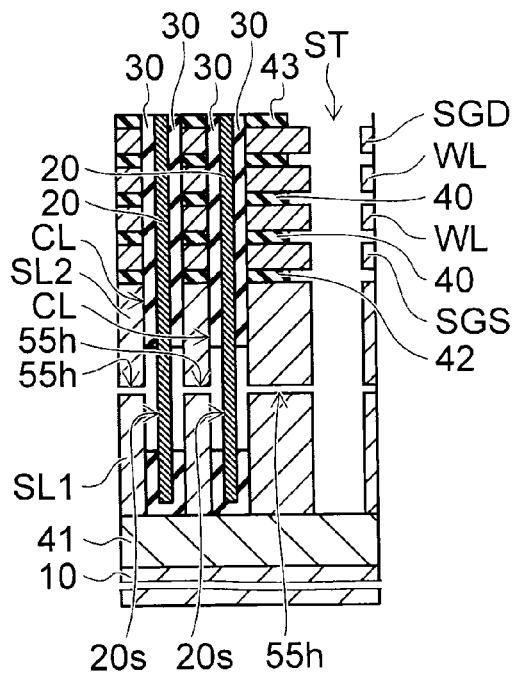

As shown in FIG. 6B, the portion of the memory film 30 exposed in the cavity 55h is removed by etching through the slit ST and the cavity 55h. As a method for removing the memory film 30 including, for example, a silicon oxide film and a silicon nitride film, an isotropic etching method using, for example, a diluted hydrofluoric acid solution and a hot phosphoric acid solution is performed.

In this case, in addition to the memory film 30 exposed in the cavity 55h, the memory film 30 contiguous to the cavity 55h is also removed. Due to this, the side surface 20s of the channel body 20 is exposed in the cavity 55h.

Figure 6C:
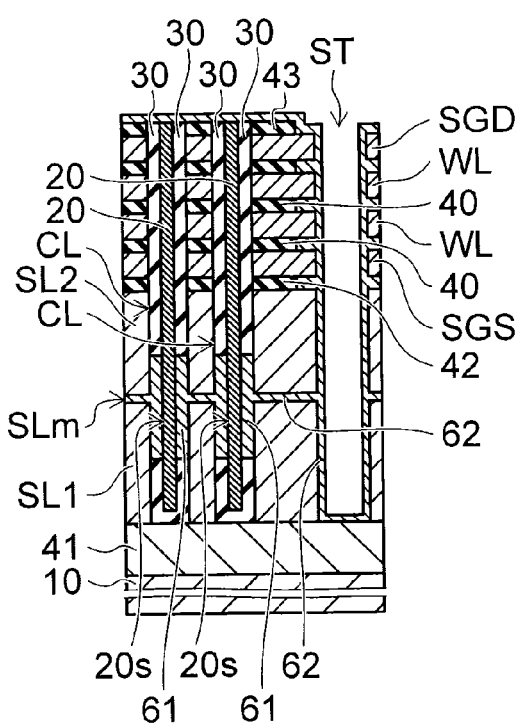

Next, as shown in FIG. 6C, the side wall film 61 and the inter-layer film 62 that are an undoped amorphous silicon film are integrally formed in the cavity 55h. Due to this, the intermediate layer SLm is formed.

The side surface 20s of the channel body 20 is covered with the side wall film 61. The inter-layer film 62 is formed between the first source layer SL1 and the second source layer SL2.

When the intermediate layer SLm is formed, the side surface 20s of the channel body 20 is doped n-type. A method for doping the side surface 20s of the channel body 20 is as follows. For example, undoped amorphous silicon is formed as the intermediate layer SLm in the cavity 55h. Since the first source layer SL1 and the second source layer SL2 are each, for example, a phosphorus-doped polysilicon film, so-called auto-doping occurs in the intermediate layer SLm and the side surface 20s of the channel body 20 due to heat in deposition of the intermediate layer SLm. That is, the phosphorus in the first source layer SL1 and the second source layer SL2 diffuses into the intermediate layer SLm and the side surface 20s of the channel body 20, and thus the intermediate layer SLm and the side surface 20s of the channel body 20 become phosphorus-doped n-type silicon.

Alternatively, phosphorus may be doped into the side surface 20s of the channel body 20 by embedding, not an undoped amorphous silicon film, but a phosphorus-doped amorphous silicon film as the intermediate layer SLm in the cavity 55h. Alternatively, before forming the intermediate layer SLm, phosphorus is vapor-phase diffused in the cavity 55h in a hydrogen phosphide atmosphere. Due to this, phosphorus is doped into the side surface 20s of the channel body 20. Thereafter, amorphous silicon is embedded as the intermediate layer SLm in the cavity 55h.

In any case, the contact resistance between the side surface 20s of the channel body 20 and the intermediate layer SLm is reduced, and the side surface 20s of the channel body 20 is electrically connected with the intermediate layer SLm. The intermediate layer SLm is electrically connected with each of the first source layer SL1 and the second source layer SL2. Due to this, the side surface 20s of the channel body 20 is electrically connected with each of the first source layer SL1 and the second source layer SL2 via the intermediate layer SLm.

Figure 6D:
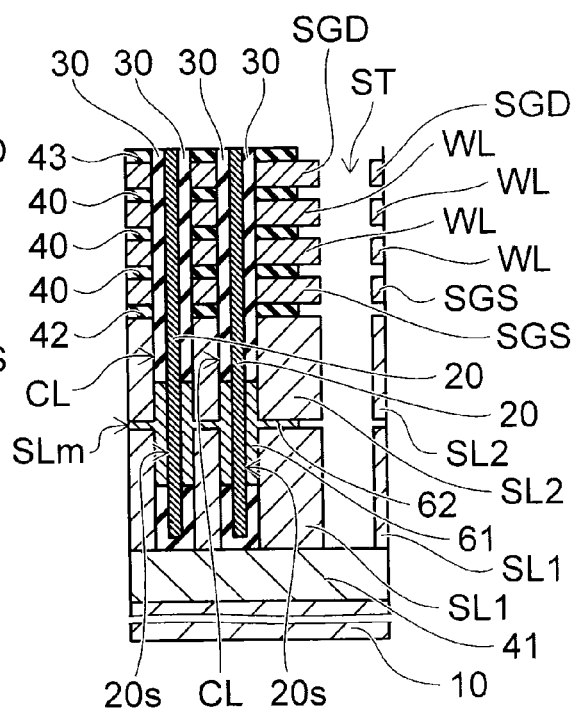

Next, as shown in FIG. 6D, the intermediate layer SLm formed on the inner wall of the slit ST and the insulating layer 43 is removed. As a method for removing the intermediate layer SLm, for example, a chemical dry etching (CDE) method is used. Due to this, the inter-layer film 62 between the first source layer SL1 and the second source layer SL2 is formed so as to be depressed (recessed) from the respective side surfaces of the first source layer SL1 and the second source layer SL2 on the slit ST side toward a direction away from the central axis of the slit ST.

Thereafter, as shown in FIG. 2, an insulating film is embedded in the slit ST by low pressure chemical vapor deposition (LPCVD) to form the insulating isolation portion 51. The insulating film is formed also in a gap that is formed between the first source layer SL1 and the second source layer SL2 due to the recession of the inter-layer film 62, and the insulating isolation portion 51 is in contact with the inter-layer film 62. Before forming the insulating isolation portion 51, the electrode layers WL may be silicided through the slit ST. Thereafter, the bit line BL and the like are formed on the insulating layer 43. Due to this, the semiconductor memory device of the embodiment is obtained.

According to the embodiment, the intermediate layer SLm that connects the side surface 20s of the channel body 20 with the source layer SL is formed by the replacing process using the sacrificial layer 55. Due to this, only the memory film 30 that is formed on the side surface of the memory hole MH can be etched. Therefore, the memory film 30 of the memory cells that are formed above the side surface 20s of the channel body 20 is not affected by etching. Hence, characteristic variations or deterioration of the memory cells can be suppressed.

According to the embodiment as has been described above, it is possible to realize an improvement in reliability and a higher speed operation.

Next, a method for manufacturing a semiconductor memory device of another embodiment will be described with reference to FIG. 7A to FIG. 9D.

Figure 7A:
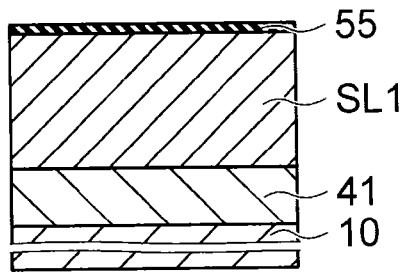
FIG. 7A to FIG. 9D are schematic views showing a method for manufacturing the semiconductor memory device of another embodiment.

Similarly to the description described above, the first source layer SL1 is formed on the substrate 10 via the conductive layer 41. As shown in FIG. 7A, the sacrificial layer 55 is formed on the first source layer SL1. The sacrificial layer 55 contains, for example, at least any of silicon oxide, silicon nitride, tungsten, phosphorus-doped polysilicon, and tungsten silicide. In the embodiment, for example, a boron silicate glass (BSG) film is used for the sacrificial layer 55. The sacrificial layer 55 is removed by a replacing process described later. The intermediate layer SLm is formed in the portion (the cavity 55h) from which the sacrificial layer 55 is removed.

Figure 7B:
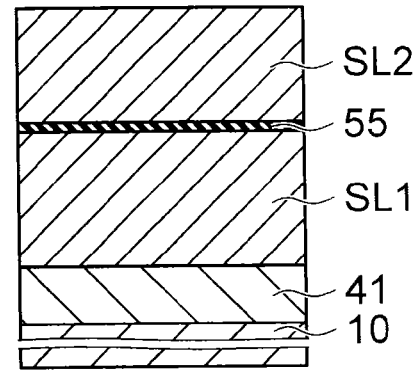

As shown in FIG. 7B, the second source layer SL2 is formed on the sacrificial layer 55. Thereafter, the insulating layer 42 is formed on the second source layer SL2.

Figure 7C:
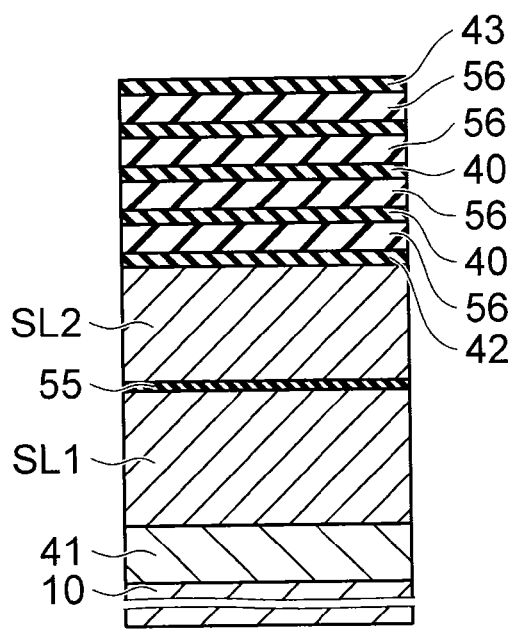

As shown in FIG. 7C, a stacked body including the insulating layers 40 and stacked sacrificial layers 56 (third layer) alternately stacked on each other is formed on the insulating layer 42. The insulating layer 43 is formed on the stacked body. For example, a dTEOS film (silicon oxide film formed by plasma chemical vapor deposition (CVD)) is used as the insulating layer 40.

The stacked sacrificial layer 56 contains, for example, at least any of silicon oxide, silicon nitride, tungsten, phosphorus-doped polysilicon, and tungsten silicide. In the embodiment, for example, a silicon nitride film is used for the stacked sacrificial layer 56. The stacked sacrificial layers 56 are removed by a replacing process described later. The source-side selection gate SGS, the electrode layers WL, and the drain-side selection gate SGD are formed in portions (cavities 56h) from which the stacked sacrificial layers 56 are removed.

The replacing process using the stacked sacrificial layers 56 is performed in a process different from the replacing process using the sacrificial layer 55. Therefore, the stacked sacrificial layer 56 contains a material different from that of the sacrificial layer 55.

Figure 7D:
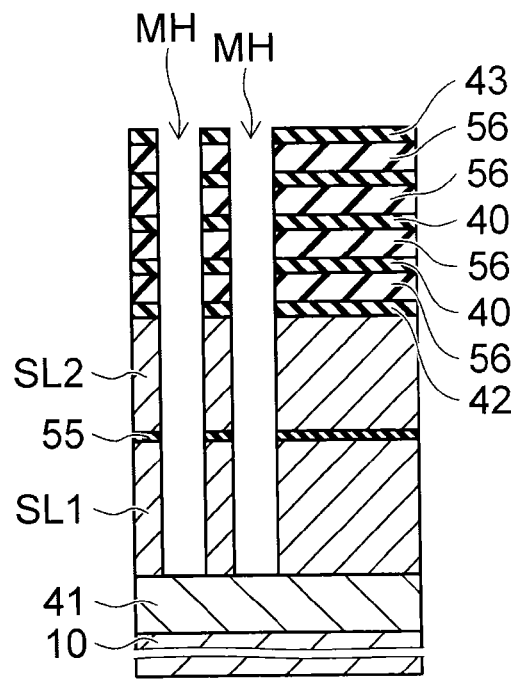

Next, as shown in FIG. 7D, the memory holes MH are formed. When the memory holes MH are formed, the conductive layer 41 is used as an etching stopper. The memory hole MH penetrates from the insulating layer 43 to the first source layer SL1.

Figure 8A:
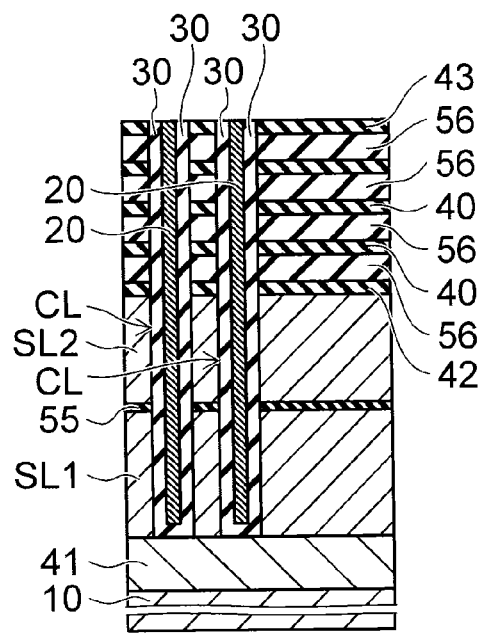

After forming the memory holes, the films (the memory film 30, the channel body 20, and the like) shown in FIG. 3 are successively formed on the inner wall of each of the memory holes MH as shown in FIG. 8A. Due to this, the columnar portions CL are formed.

Figure 8B:
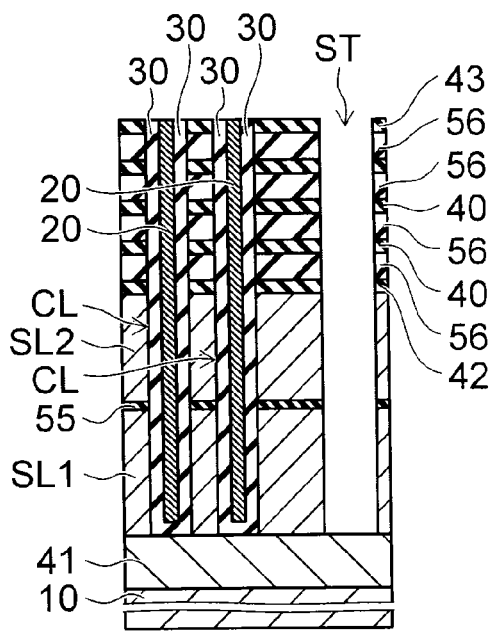

Thereafter, as shown in FIG. 8B, the slit ST is formed. When the slit ST is formed, the conductive layer 41 is used as an etching stopper. The slit ST penetrates from the insulating layer 43 to the first source layer SL1. The stacked sacrificial layers 56 and the sacrificial layer 55 are exposed in the side walls of the slit ST.

Figure 8C:
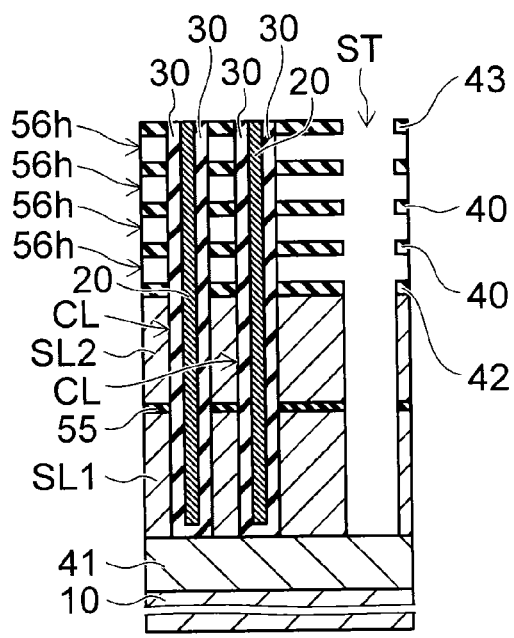

As shown in FIG. 8C, the stacked sacrificial layers 56 are removed by etching through the slit ST. As a method for removing the stacked sacrificial layers 56, an etching method using, for example, a hot phosphoric acid solution is performed. Due to this, the cavities 56h (gap portions) are formed in the portions from which the stacked sacrificial layers 56 are removed. The cavities 56h are in communication with the slit ST.

Moreover, even if a portion of the memory film 30 is removed when the stacked sacrificial layer 56 is removed, the portion of the memory film 30 (the charge storage film 32, the block insulating film 35, and the like) can be formed at a portion of the columnar portion CL contiguous to the cavity 56h through the slit ST and the cavity 56h. That is, before forming the electrode layer WL in the cavity 56h, a portion of the memory film 30 can be formed on the outer wall of the columnar portion CL exposed in the cavity 56h. Moreover, it is also possible to form the memory film 30 such that only the channel body 20 is formed in the memory hole MH without forming the memory film 30, and that before forming the electrode layer WL in the cavity 56h, the memory film 30 is formed on the side surface of the channel body 20 exposed in the cavity 56h. Due to this, a portion (back surface) of the columnar portion CL contiguous to the cavity 56h can be covered with the memory film 30.

Figure 8D:
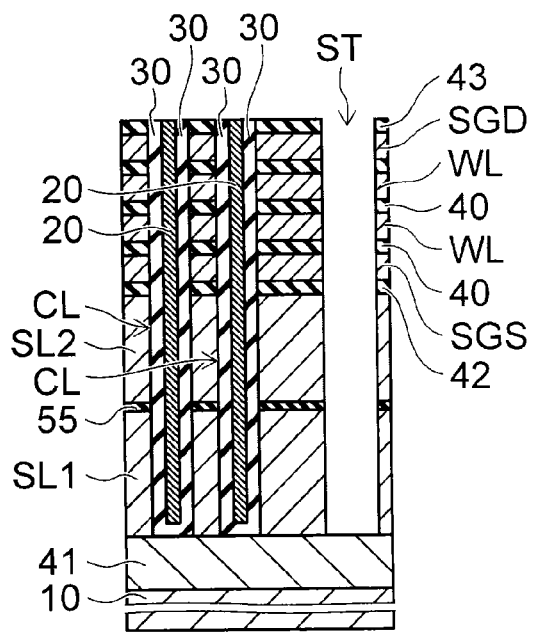

As shown in FIG. 8D, a conductive film is embedded in the cavities 56h by, for example, a CVD method through the slit ST, and the source-side selection gate SGS, the electrode layers WL, and the drain-side selection gate SGD are formed, so that the stacked body is formed. Each of the source-side selection gate SGS, the electrode layer WL, and the drain-side selection gate SGD contains, for example, tungsten. The conductive film formed on the side walls and bottom portion of the slit ST is removed.

The source-side selection gate SGS is formed on the insulating layer 42. The insulating layers 40 and the electrode layers WL are alternately stacked on the source-side selection gate SGS. The drain-side selection gate SGD is formed below the insulating layer 43.

Figure 9A:
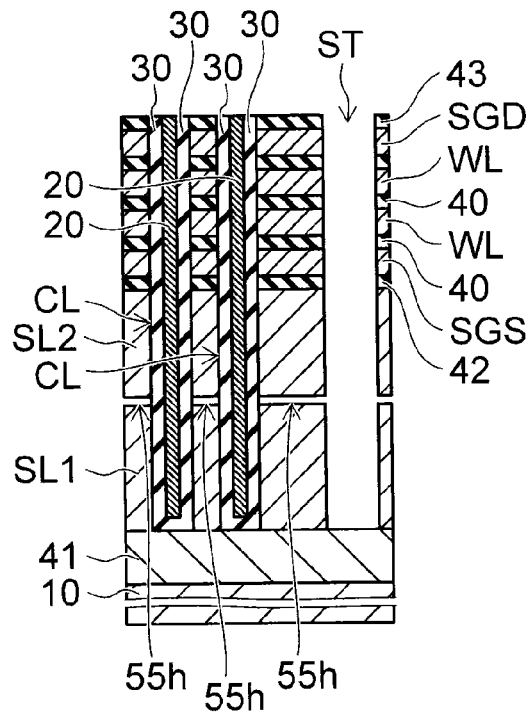

Thereafter, as shown in FIG. 9A, the sacrificial layer 55 is removed by etching through the slit ST. As a method for removing the sacrificial layer 55, an isotropic etching method using, for example, hot hydrofluoric acid in vapor phase is performed. Due to this, the cavity 55h is formed between the first source layer SL1 and the second source layer SL2. The cavity 55h is in communication with the slit ST.

The columnar portion CL penetrates the cavity 55h, and the memory film 30 is exposed in the cavity 55h. The memory film 30 covers the channel body 20.

Figure 9B:
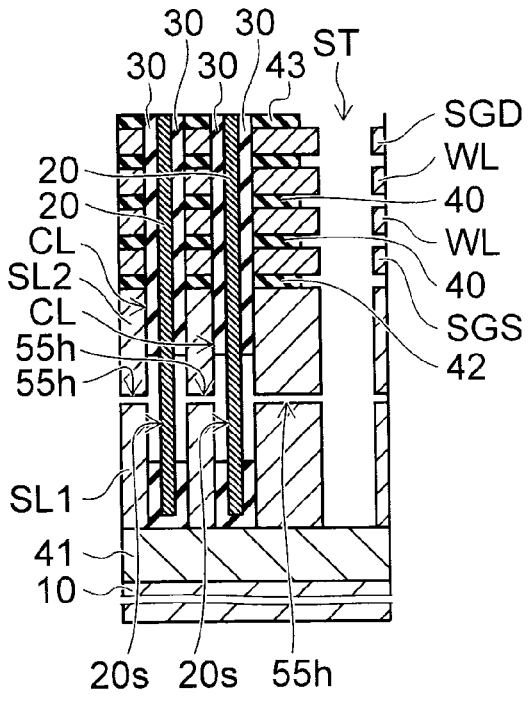

As shown in FIG. 9B, the portion of the memory film 30 exposed in the cavity 55h is removed by etching through the cavity 55h. As a method for removing the memory film 30, an isotropic etching method using, for example, a diluted hydrofluoric acid solution and a hot phosphoric acid solution is performed.

In this case, in addition to the memory film 30 exposed in the cavity 55h, the memory film 30 contiguous to the cavity 55h is also removed. Due to this, the side surface 20s of the channel body 20 is exposed in the cavity 55h.

Figure 9C:
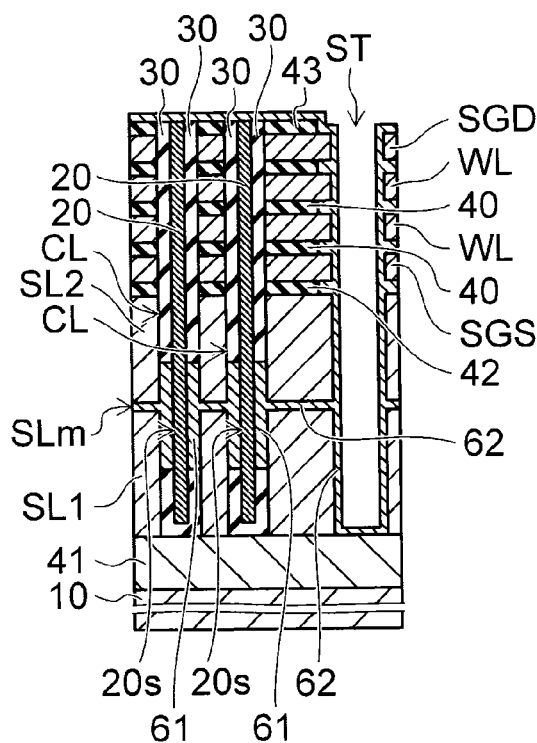

Next, as shown in FIG. 9C, an amorphous silicon film, for example, is embedded in the cavity 55h. Due to this, the intermediate layer SLm is formed. In this case, similarly to the embodiment described above, the side surface 20s of the channel body 20 is doped n-type.

The side wall film 61 and the inter-layer film 62 are integrally formed on the side surface 20s of the channel body 20, and between the first source layer SL1 and the second source layer SL2. Due to this, the intermediate layer SLm is formed.

The side surface 20s of the channel body 20 is covered with the side wall film 61. The inter-layer film 62 is formed between the first source layer SL1 and the second source layer SL2.

The side surface 20s of the channel body 20 is electrically connected with the intermediate layer SLm. The intermediate layer SLm is electrically connected with each of the first source layer SL1 and the second source layer SL2. Due to this, the side surface 20s of the channel body 20 is electrically connected with each of the first source layer SL1 and the second source layer SL2 via the intermediate layer SLm.

When the intermediate layer SLm is formed, the side surface 20s of the channel body 20 is doped n-type, similarly to the manufacturing method described above.

Figure 9D:
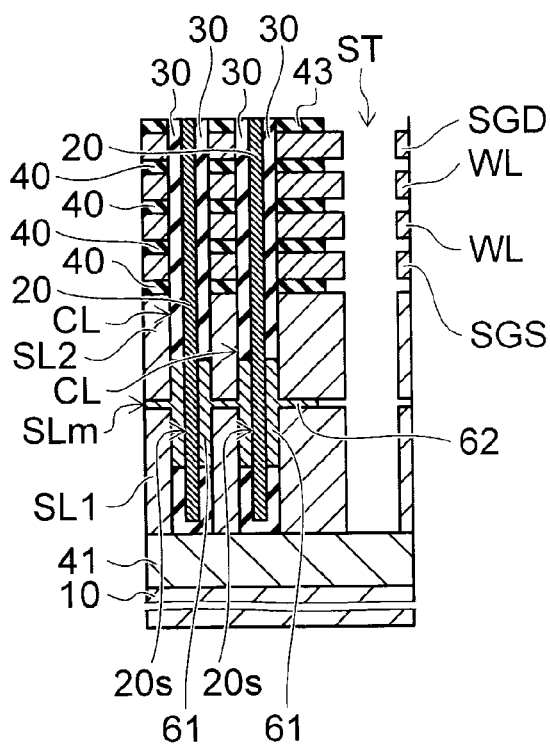

Thereafter, as shown in FIG. 9D, the inter-layer film 62 formed on the inner wall of the slit ST is removed. As a method for removing the inter-layer film 62, for example, a CDE method is used. Due to this, the inter-layer film 62 is formed so as to be depressed from the first source layer SL1 and the second source layer SL2 toward the direction away from the central axis of the slit ST.

Thereafter, an insulating film is embedded in the slit ST by LPCVD to form the insulating isolation portion 51. Before forming the insulating isolation portion 51, the electrode layers WL may be silicided through the slit ST. Thereafter, the bit line BL and the like are formed on the insulating layer 43. Due to this, the semiconductor memory device of the embodiment is obtained.

The processes from the process for removing the stacked sacrificial layer 56 to the process for forming the stacked body may be implemented after the processes from the process for removing the sacrificial layer 55 to the process for forming the intermediate layer SLm.

According to the embodiment, it is possible to realize an improvement in reliability and a higher speed operation, similarly to the embodiment described above. Further, with the above-described process for covering the portion (back surface) of the columnar portion CL contiguous to the cavity 56h with the memory film 30, the reliability of the memory film 30 can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a first layer;
   a stacked body provided above the first layer and including a plurality of electrode layers separately stacked each other;
   a second layer provided between the first layer and the stacked body;
   an intermediate layer provided between the first layer and the second layer;
   a semiconductor body provided in the stacked body, the second layer, the intermediate layer and the first layer, the semiconductor body extending in a stacking direction of the stacked body; and
   a charge storage film provided between the semiconductor body and the plurality of electrode layers,
   the semiconductor body including a side surface connected with the intermediate layer in the vicinity of a boundary between the first layer and the second layer,
   at least one of the first layer and the second layer having conductivity and connected with the intermediate layer.

2. The device according to claim 1, wherein the intermediate layer includes a first film, the first film is in contact with the side surface of the semiconductor body and covers the side surface.

3. The device according to claim 1, wherein the intermediate layer includes a second film, the second film is in contact with the first layer and the second layer, and provided between the first layer and the second layer.

4. The device according to claim 1, wherein the intermediate layer is a semiconductor film containing an impurity.

5. The device according to claim 1, wherein the intermediate layer contains a same material as that of the first layer and the second layer.

6. The device according to claim 1, further comprising a conductive layer provided below the first layer, being in contact with the first layer, and including metal or a metal compound.

7. The device according to claim 6, wherein the first layer has conductivity and electrically connects the semiconductor body and the conductive layer.

8. The device according to claim 7, wherein the second layer has conductivity and electrically connects the semiconductor body, the first layer and the conductive layer.

9. The device according to claim 1, wherein a bottom portion of the semiconductor body is covered with the charge storage film.

10. The device according to claim 1, wherein
    the semiconductor body includes a plurality of semiconductor portions provided in the stacked body, the second layer, the intermediate layer and the first layer, the plurality of semiconductor portions extending in the stacking direction, and
    the intermediate layer is continuous between the plurality of semiconductor portions.

11. The device according to claim 1, further comprising an insulating portion provided in the stacked body, the second layer, the intermediate layer and the first layer, the insulating portion extending in the stacking direction.

12. The device according to claim 11, wherein the insulating portion is in contact with the intermediate layer.

13. The device according to claim 2, wherein the first film divides the charge storage film in the stacking direction.

14. The device according to claim 1, wherein a work function of the second layer is lower than a work function of the semiconductor body.

* * * * *